(12) United States Patent
Mohamadi

(10) Patent No.: US 7,884,776 B2
(45) Date of Patent: *Feb. 8, 2011

(54) HIGH POWER INTEGRATED CIRCUIT BEAMFORMING ARRAY

(76) Inventor: Farrokh Mohamadi, 8 Halley, Irvine, CA (US) 92612-3797

( * ) Notice: Subject to any disclaimer, the term of this patent is extended or adjusted under 35 U.S.C. 154(b) by 1053 days.

This patent is subject to a terminal disclaimer.

(21) Appl. No.: 11/616,235

(22) Filed: Dec. 26, 2006

(65) Prior Publication Data

US 2008/0079636 A1  Apr. 3, 2008

Related U.S. Application Data

(63) Continuation-in-part of application No. 11/536,625, filed on Sep. 28, 2006, now Pat. No. 7,791,556.

(51) Int. Cl.
*H01Q 21/00* (2006.01)

(52) U.S. Cl. ............................ 343/853; 343/850

(58) Field of Classification Search .......... 343/700 MS, 343/853, 850
See application file for complete search history.

(56) References Cited

U.S. PATENT DOCUMENTS

| 7,312,763 B2 * | 12/2007 | Mohamadi | 343/853 |
| 7,321,339 B2 * | 1/2008 | Mohamadi | 343/853 |
| 7,423,607 B2 * | 9/2008 | Mohamadi | 343/853 |
| 7,542,005 B2 * | 6/2009 | Mohamadi | 343/853 |
| 7,554,504 B2 * | 6/2009 | Mohamadi | 343/776 |
| 2008/0079649 A1 * | 4/2008 | Mohamadi | 343/853 |

* cited by examiner

*Primary Examiner*—Tan Ho
(74) *Attorney, Agent, or Firm*—Haynes & Boone, LLP.

(57) ABSTRACT

In one embodiment, an integrated circuit antenna array is provided that includes: a low voltage substrate supporting an RF transmission network, and a high voltage substrate bonded to the low voltage substrate, the high voltage substrate supporting a plurality of antennas coupled to the RF transmission network through power amplifiers integrated into a surface of the high voltage substrate.

20 Claims, 16 Drawing Sheets

HIGH POWER INTEGRATED CIRCUIT BEAMFORMING ARRAY

RELATED APPLICATION

This application is a continuation-in-part of U.S. application Ser. No. 11/536,625, filed Sep. 28, 2006 now U.S. Pat. No. 7,791,556.

TECHNICAL FIELD

The present invention relates generally to integrated circuits, and more particularly to an integrated beamforming array.

BACKGROUND

Conventional beamforming systems are often cumbersome to manufacture. In particular, conventional beamforming antenna arrays require complicated feed structures and phase-shifters that are impractical to be implemented in a semiconductor-based design due to its cost, power consumption and deficiency in electrical characteristics such as insertion loss and quantization noise levels. In addition, such beamforming arrays make digital signal processing techniques cumbersome as the operating frequency is increased. In addition, at the higher data rates enabled by high frequency operation, multipath fading and cross-interference become a serious issue. Adaptive beamforming techniques are known to combat these problems. But adaptive beamforming for transmission at 10 GHz or higher frequencies requires massively parallel utilization of A/D and D/A converters.

To provide a beamforming system compatible with semiconductor processes, the applicant has provided a number of integrated antenna architectures. For example, U.S. application Ser. No. 11/454,915, issued as U.S. Pat. No. 7,683,852, the contents of which are incorporated by reference, discloses a beamforming system in which an RF signal is distributed through a transmission network to integrated antenna circuits that include a beamforming circuit that adjusts the phase and/or the amplitude of distributed RF signal responsive to control from a controller/phase manager circuit. In a receive configuration, each beamforming circuit adjusts the phase and/or the amplitude of a received RF signal from the corresponding integrated circuit's antenna and provide the resulting adjusted received RF signal to the transmission network. Although such integrated antenna circuits consume a relatively small amount of power, transmission loss is incurred through the resulting RF propagation in the transmission network. To account for such loss, U.S. application Ser. No. 11/454,915 discloses a distributed amplification system such that RF signals propagated through the transmission network are actually amplified rather than attenuated. However, the transmission network introduces dispersion as well.

To avoid the dispersion introduced by an RF transmission network, an alternative integrated circuit (which may also be denoted as an integrated oscillator circuit) has been developed such as disclosed in U.S. Pat. No. 6,982,670. For example, each integrated oscillator/antenna circuit may include an oscillator such as a phase-locked loop (PLL) and a corresponding antenna and mixer. In such an embodiment, each PLL is operable to receive a reference signal and provide a frequency-shifted signal output signal that is synchronous with the reference signal. Should an integrated oscillator/antenna circuit be configured for transmission, its output signal is upconverted in the unit's mixer and the upconverted signal transmitted by the corresponding antenna. Alternatively, should an integrated oscillator/antenna circuit be configured for reception, a received RF signal from the unit's antenna is downconverted in the mixer responsive to the frequency-shifted output signal from the PLL. Although the integrated oscillator circuit approach does not have the dispersion issues resulting from propagation through a transmission network, the inclusion of an oscillator in each integrated oscillator circuit demands significantly more power than the transmission network approach.

To avoid the dispersion resulting from propagation through a transmission network or the expense of an integrated oscillator approach, a distributed oscillator architecture has been developed as disclosed in U.S. application Ser. No. 11/536,625. In this architecture, a resonant transmission network with distributed amplification is driven by a triggering pulse waveform such that the entire transmission network oscillates acting as a distributed oscillator. In this fashion, high frequency RF signals and/or narrowband pulses from the resonant transmission signal are coupled in a globally synchronized fashion to the various integrated antennas. Each antenna (or a subset of antennas) may include a phase-shifter and/or attenuator to provide beamforming capabilities. Although this resonant approach is compatible with conventional semiconductor processes, the smaller dimensions of modern semiconductor processes are not compatible with large voltages. For example, it is conventional in certain CMOS processes to limit signal voltages to 2.5 V or even 1.5V or less. Voltages in excess of these limits may damage the devices or cause long term reliability issues adversely impacting their performance. This limit on voltage places a limit on the amount of transmit power that can be delivered to the antennas. Accordingly, there is a need in the art for integrated solutions compatible with high power operation.

SUMMARY

In accordance with an aspect of the invention, an integrated circuit antenna array is provided that includes: a low voltage substrate supporting an RF transmission network, and a high voltage substrate bonded to the low voltage substrate, the high voltage substrate supporting a plurality of antennas coupled to the RF transmission network through power amplifiers integrated into a surface of the high voltage substrate.

In accordance with another aspect of the invention, an antenna array is provided that includes: a high voltage semiconductor substrate having a first surface and an opposing second surface; a plurality of heavily-doped contact regions extending from the first surface to the second surface; a plurality of antennas formed on a metal layer deposited on the first surface, each antenna being coupled to corresponding ones of the contact regions by vias to corresponding power amplifiers integrated into the second surface of the high voltage semiconductor substrate; and a low voltage substrate having a first surface adjacent a plurality of metal layers forming a conductor-based RF feed network adjacent the first surface for coupling an input port to the plurality of antennas, the RF feed network coupling to a distributed plurality of amplifiers integrated into the first surface of the low voltage substrate, wherein the RF feed network and the distributed plurality of amplifiers are configured to form a resonant network such that if a timing signal is injected into the input port of the RF feed network, a globally synchronized RF signal is received at each of the antennas.

In accordance with another aspect of the invention, an antenna array is provided that includes: a high voltage semiconductor substrate having a first surface and an opposing second surface; a plurality of heavily-doped contact regions extending from the first surface to the second surface; a plurality of antennas formed on an insulating layer deposited on the first surface, each antenna being coupled to corresponding ones of the contact regions by vias to corresponding power amplifiers integrated into the second surface of the high voltage semiconductor substrate; and a low voltage substrate having a first surface adjacent a plurality of metal layers forming a conductor-based RF feed network adjacent the first surface for coupling an input port to the plurality of antennas, the RF feed network coupling to a distributed plurality of amplifiers integrated into the first surface of the low voltage substrate, wherein the RF feed network and the distributed plurality of amplifiers are configured to form a resonant network such that if a timing signal is injected into the input port of the RF feed network, a globally synchronized RF signal is received at each of the antennas.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
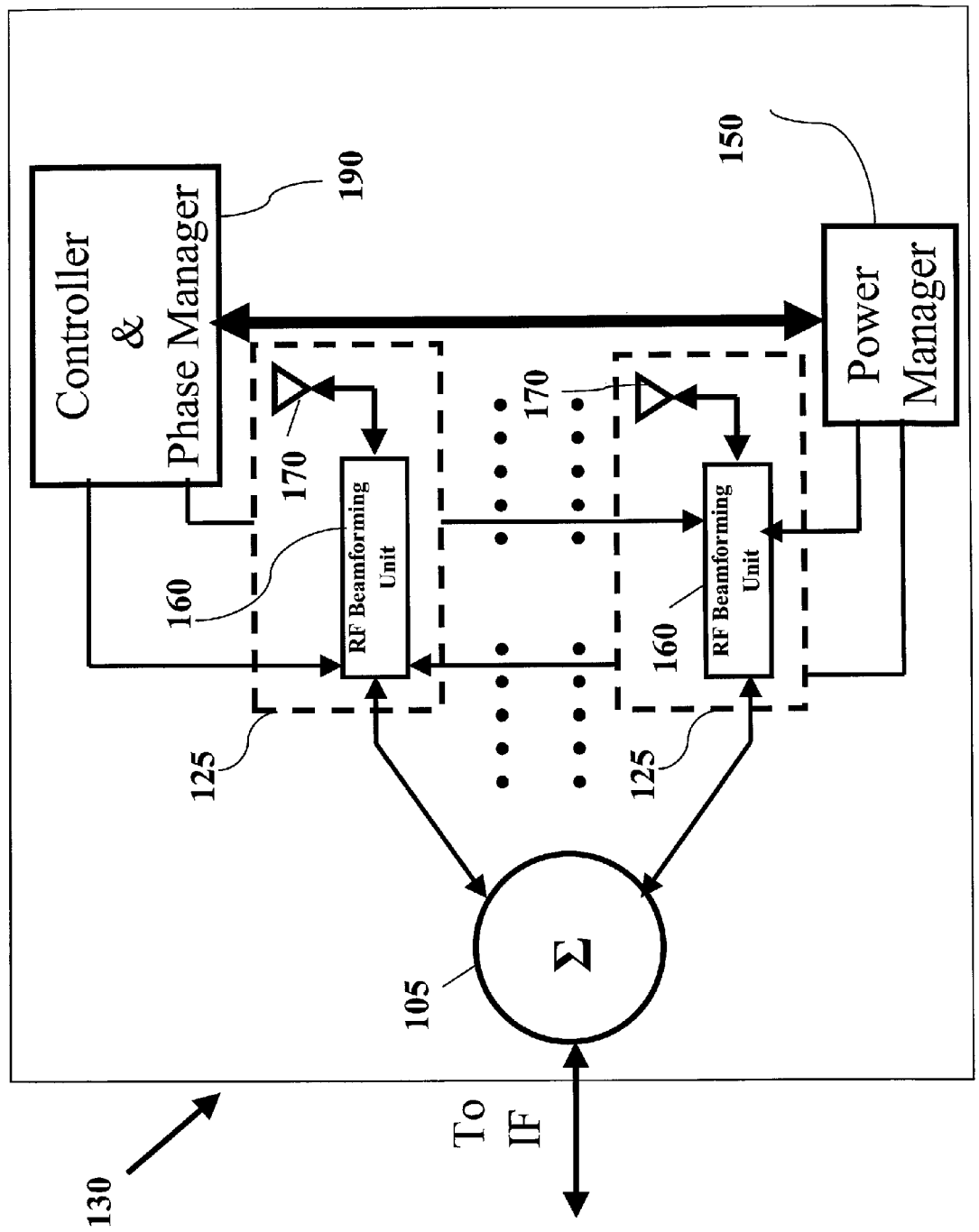
FIG. 1 is a block diagram of a beamforming antenna array in which the beamforming is performed in the RF domain.

As discussed previously, an integrated circuit beamforming array may be constructed using a transmission network that distributes an RF signal to and from a plurality of antennas. In some embodiments, the semiconductor substrate may comprise a wafer such that the resulting integrated circuit may be denoted as a wafer scale antenna module (WSAM). The transmission network may include distributed amplifiers such as those discussed in U.S. application Ser. No. 11/454, 915. In such embodiments, an RF signal is driven into an input port for the transmission network, amplified through the distributed amplifiers coupled to the transmission network, and distributed through the transmission network to the plurality of integrated antennas. An exemplary embodiment is illustrated in FIG. 1, which illustrates an integrated RF beamforming and controller unit 130. The transmission network with distributed amplification is conceptually illustrated by an adder 105, which may receive an RF signal from an intermediate frequency (IF) stage (not illustrated). Alternatively, a direct downconversion architecture may be implemented. In this embodiment, the receive and transmit antenna arrays are the same such that each antenna 170 functions to both transmit and receive. A plurality of integrated antenna circuits 125 coupled to the transmission network each includes an RF beamforming interface circuit 160 and receive/transmit antenna 170. RF beamforming interface circuit 160 adjusts the phase and/or the amplitude of the received and transmitted RF signal responsive to a control signal from a controller/phase manager circuit 190. Although illustrated having a one-to-one relationship between beamforming interface circuits 160 and antennas 170, it will be appreciated, however, that an integrated antenna circuit 125 may include a plurality of antennas all driven by RF beamforming interface circuit 160.

Figure 2:
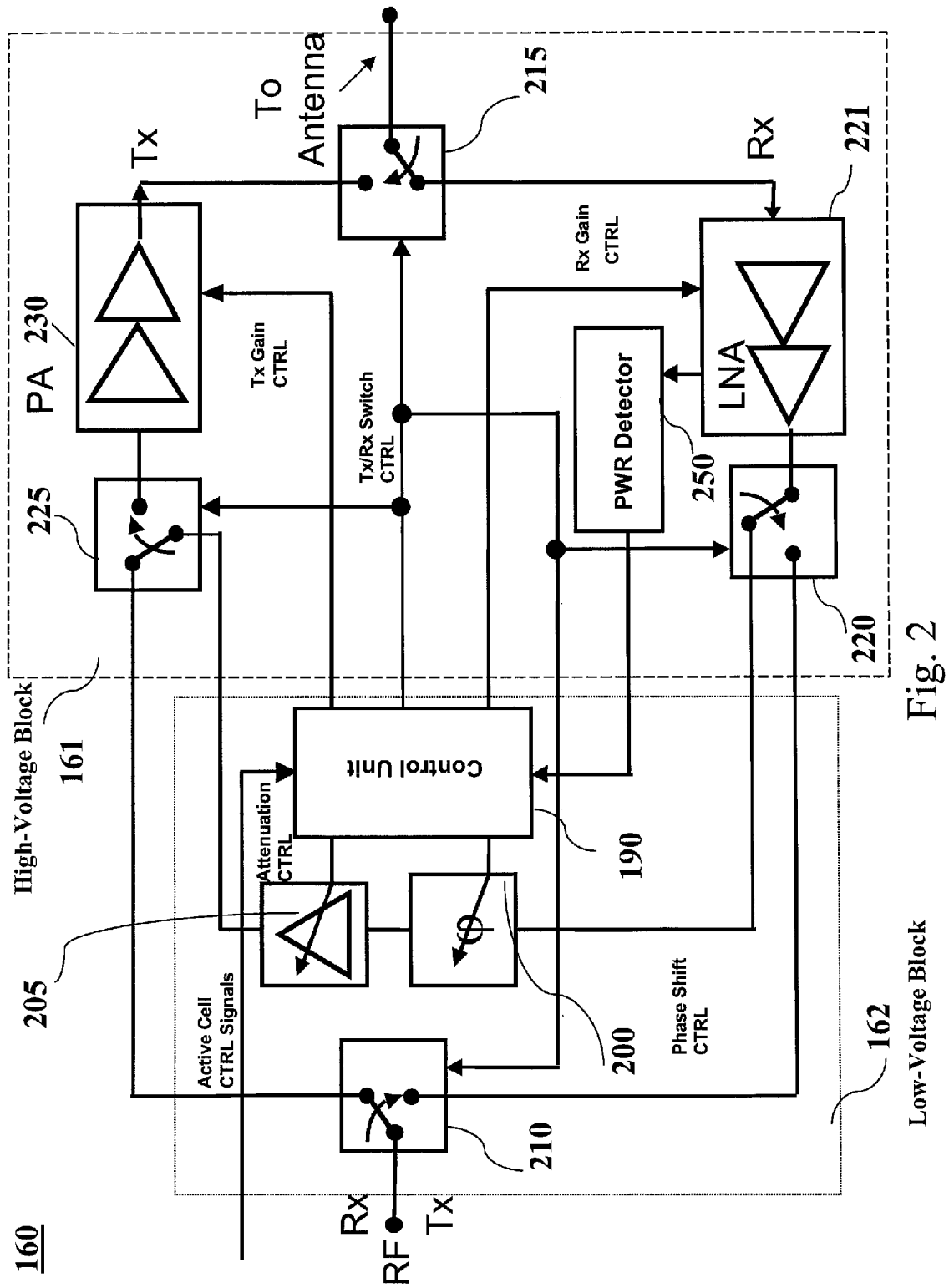
FIG. 2 is a schematic illustration of an RF beamforming interface circuit for the array of FIG. 1 having a high voltage substrate and a low voltage substrate.

A circuit diagram for an exemplary embodiment of RF beamforming interface circuit 160 is shown in FIG. 2. Note that the beamforming performed by beamforming circuits 160 may be performed using either phase shifting, amplitude variation, or a combination of both phase shifting and amplitude variation. Accordingly, RF beamforming interface circuit 160 is shown including both a variable phase shifter 200 and a variable attenuator 205. It will be appreciated, however, that the inclusion of either phase shifter 200 or attenuator 205 will depend upon the type of beamforming being performed. To provide a compact design, RF beamforming circuit may include RF switches/multiplexers 210, 215, 220, and 225 so that phase shifter 200 and attenuator 205 may be used in either a receive configuration or a transmit configuration. For example, in a receive configuration RF switch 215 routes the received RF signal to a low noise amplifier 221. The resulting amplified signal is then routed by switch 220 to phase shifter 200 and/or attenuator 205. The phase shifting and/or attenuation provided by phase shifter 200 and attenuator 205 are under the control of controller/phase manager circuit 190. The phase shifted signal routes through RF switch 225 to RF switch 210. RF switch 210 then routes the signal to IF processing circuitry through the transmission network (not illustrated).

In a transmit configuration, the RF signal received from IF processing circuitry (alternatively, a direct down-conversion architecture may be used to provide the RF signal) routes through RF switch 210 to RF switch 220, which in turn routes the RF signal to phase shifter 200 and/or attenuator 205. The resulting shifted signal is then routed through RF switch 225 to a power amplifier 230. The amplified RF signal then routes through RF switch 215 to antenna 170 (FIG. 1). It will be appreciated, however, that different configurations of switches may be implemented to provide this use of a single set of phase-shifter 200 and/or attenuator 205 in both the receive and transmit configuration. In addition, alternate embodiments of RF beamforming interface circuit 160 may be constructed not including switches 210, 220, and 225 such that the receive and transmit paths do not share phase shifter 200 and/or attenuator 205. In such embodiments, RF beamforming interface circuit 160 would include separate phase-shifters and/or attenuators for the receive path and transmit path. Any suitable phase-shifter may be used. For example, U.S. patent application Ser. No. 11/535,928, issued as U.S. Pat. No. 7,728,784, filed Sep. 27, 2006, the contents of which are incorporated by reference discloses a particularly advantageous analog phase shifter that may be incorporated into the high power WSAM disclosed herein.

To assist the beamforming capability, a power detector 250 functions as a received signal strength indicator to measure the power in the received RF signal. For example, power detector 250 may comprise a calibrated envelope detector. As seen in FIG. 1, a power manager 150 may detect the peak power determined by the various power detectors 250 within each integrated antenna circuit 125. The integrated antenna circuit 125 having the peak detected power may be denoted as the "master" integrated antenna circuit. Power manager 150 may then determine the relative delays for the envelopes for the RF signals from the remaining integrated antenna circuits 125 with respect to the envelope for the master integrated antenna circuit 125. To transmit in the same direction as this received RF signal, controller/phase manager 190 may determine the phases corresponding to these detected delays and command the transmitted phase shifts/attenuations accordingly. Alternatively, a desired receive or transmit beamforming direction may simply be commanded by controller/phase manager 190 rather than derived from a received signal. In such embodiment, power managers 150 and 250 need not be included since phasing information will not be derived from a received RF signal.

Regardless of whether integrated antenna circuits 125 perform their beamforming using phase shifting and/or amplitude variation, the shifting and/or variation is performed on the RF signal received either from the IF stage (in a transmit mode) or from its antenna 170 (in a receive mode). By performing the beamforming directly in the RF domain as discussed with respect to FIGS. 1 and 2, substantial savings are introduced over a system that performs its beamforming in the IF or baseband domain. Such IF or baseband systems must include A/D converters for each RF channel being processed. In contrast, the system shown in FIG. 1 may supply a combined RF signal from adder 105. From an IF standpoint, it is just processing a single RF channel for the system of FIG. 1, thereby requiring just a single A/D. Accordingly, the following discussion will assume that the beamforming is performed in the RF domain. The injection of phase and/or attenuation control signals by controller/phase manager circuit 190 into each integrated antenna circuit 125 may be performed inductively as discussed in commonly-assigned U.S. Pat. No. 6,885,344, the contents of which are incorporated by reference.

The transmission network couples the RF signal from the IF stage (or alternatively, from a baseband stage in a direct downconversion embodiment) to the RF beamforming interface circuits. As disclosed in U.S. application Ser. No. 11/536,625, a particularly advantageous transmission network with regard to an integrated circuit or a wafer scale architecture is a coplanar waveguide (CPW) network. Although the scope of the invention includes the use of any suitable architecture for a transmission network such as CPW, microstrip, and planar waveguide, CPW enjoys superior shielding properties over microstrip. Thus, the following discussion will assume without loss of generality that the transmission network is implemented using CPW. This network may be arranged in an "H" array such that the electrical length from an RF input port to any given integrated antenna circuit is the same as that to all the remaining integrated antenna circuits. Although CPW has superior shielding properties, the RF propagation across a CPW network on a semiconductor wafer such as an 8" wafer may introduce losses as high as 120 dB. To counteract such losses, a plurality of distributed amplifiers may be coupled to the CPW network as disclosed in U.S. application Ser. No. 11/454,915. For example, a first linear transistor amplifier (which may be denoted as a driving amplifier) amplifies a received RF signal into a length of the CPW network into a second linear transistor amplifier (which may be denoted as a matching amplifier) configured to match its output impedance to the characteristic impedance of the CPW network. Both the gain of the driving amplifier and the gain and the output impedance of the matching amplifier are tuned using reactive loads such as integrated inductors. In this fashion, resistive losses are minimized. These gains are maintained so that linear operation is achieved. In this fashion, an RF signal driven into an input port of the CPW network is linearly amplified and propagated to the integrated antenna circuits, despite the transmission line losses.

Although the resulting transmission network advantageously overcomes its propagation losses, it will introduce substantial dispersion to high frequency RF signals and pulses. As discussed in U.S. application Ser. No. 11/536,625, a resonant transmission network may be used to avoid this dispersion through propagation. Instead of propagating an RF signal from an input port through the transmission network to the antennas, an RF triggering signal is injected into the input port. The transmission network and its distributed amplifiers is tuned so as to be resonant at the triggering signal frequency. Thus, the entire network resonates in unison, thereby leading advantageously to a global synchronization at all the antennas without the dispersion encountered in the linear amplification embodiments. Accordingly, without loss of generality, the following discussion will assume that the transmission network is a resonant CPW network.

Figure 3:
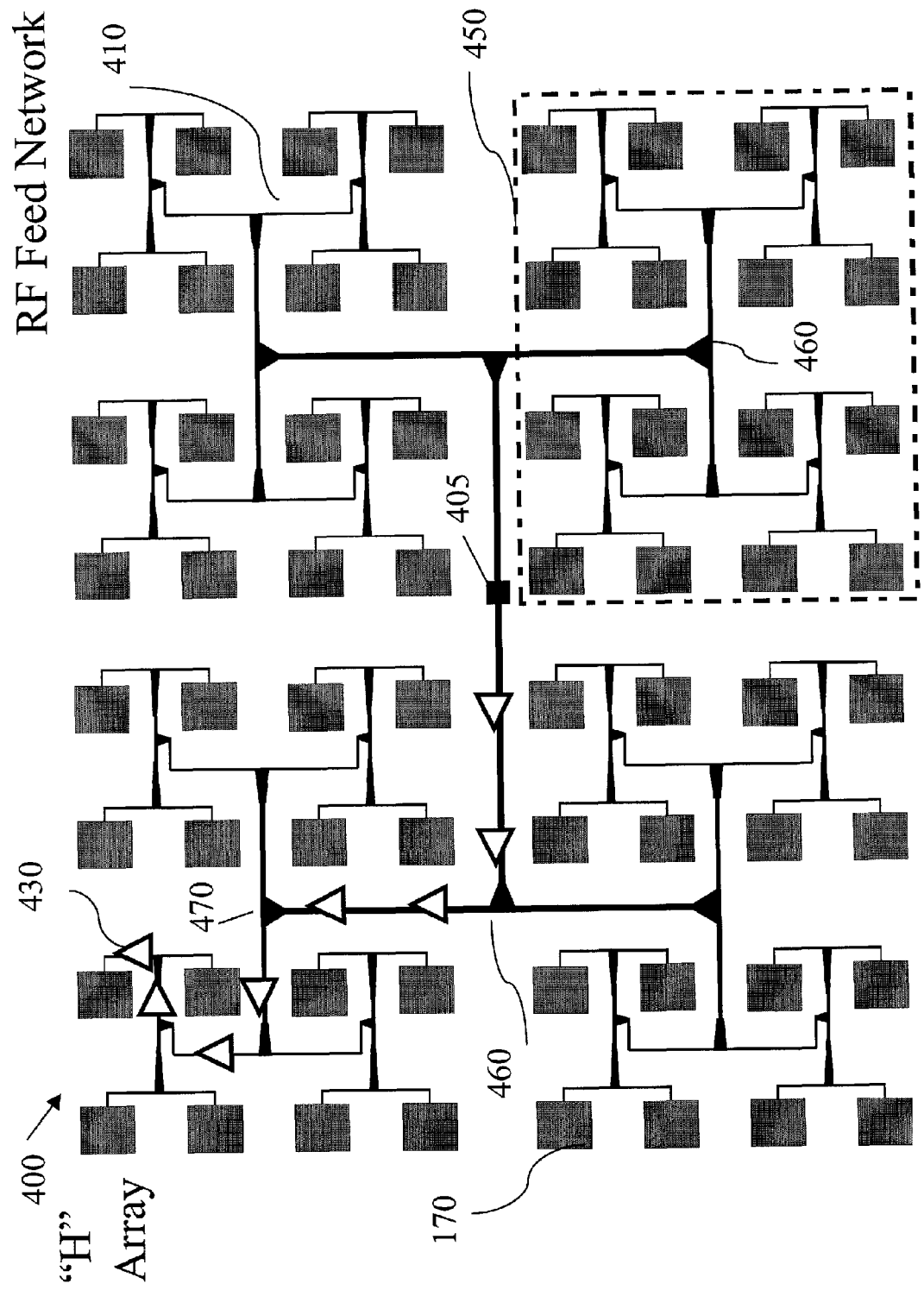
FIG. 3 is an illustration of a wafer scale resonant transmitting network implemented on a low voltage substrate bonded to a high voltage substrate supporting a plurality of antennas.
Figure 4:
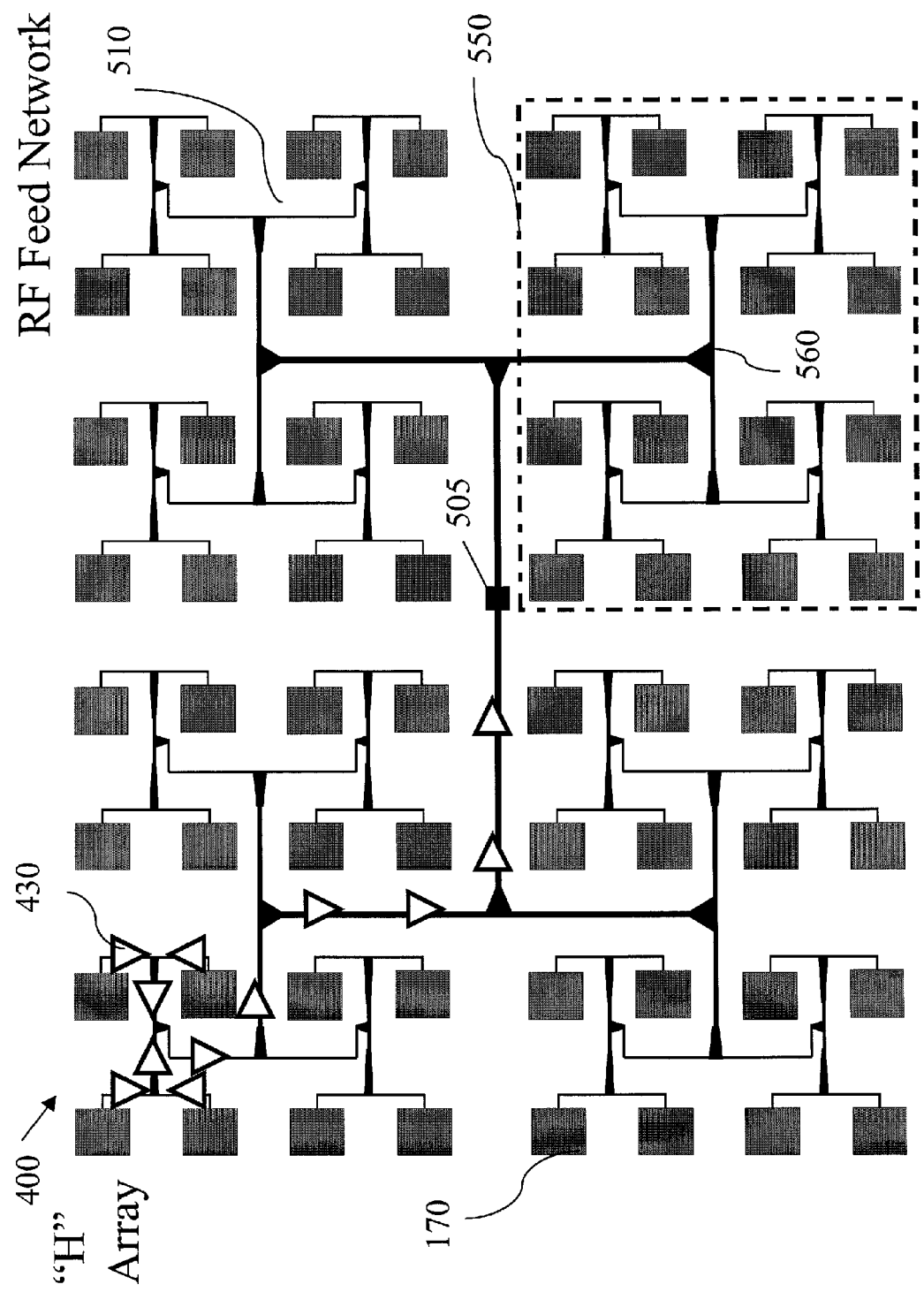
FIG. 4 is an illustration of a wafer scale receiving network having linear amplification implemented on a low voltage substrate bonded to a high voltage substrate supporting a plurality of antennas.

Turning now to FIG. 3, a resonant half-duplex transmission network 410 is implemented in an 8" wafer scale antenna module 400 coupled to 64 antenna elements 170. Because of the global synchronization provided by the resonant operation of network 410, it may also be denoted as a central clock distribution network. The triggering signal to trigger the resonant oscillation is injected into a center feed point 405. Distributed amplifiers 430 coupled to the network then injection lock to each other such that each antenna 170 may receive a globally synchronized RF signal. In contrast to the resonant transmission network, a half-duplex receiving CPW network 510 as seen in FIG. 4 for wafer scale antenna module 400 operates in the linear amplification regime as described earlier. For illustration clarity, only a subset of the distributed amplifiers is shown in networks 410 and 510.

Each transmission network may be single-ended or differential. In one embodiment, each network may comprise a coplanar waveguide (CPW) having a conductor width of a few microns (e.g., 4 microns). With such a small width or pitch to the network, a first array of 64 antenna elements and a second array of 1024 antenna elements may be readily networked in an 8 inch wafer substrate for 10 GHz and 40 GHz operation, respectively. Alternatively, a wafer scale antenna module may be dedicated to a single frequency band of operation.

The design of the distributed amplifiers is not critical so long as they provide sufficient amplification and achieve a resonant operation with the transmission network. Thus, it will be appreciated that the distributed amplifiers may comprise the driving/matching amplifiers discussed in U.S. application Ser. No. 11/536,625 or alternative distributed amplifiers may be used. In one embodiment, a driving amplifier in the receiving and transmission networks is followed by a matching amplifier for efficient performance.

The networks 510 and 410 may be formed on a substrate such as a silicon, silicon germanium, or silicon on an insulator (SOI) substrate using conventional semiconductor processes such as CMOS or BiCMOS. However, such substrates can support only a certain voltage level. The low-voltage signal limitation on conventional high-speed silicon semiconductor substrates limits the amount of power that may be coupled to any given antenna. To enable high power operation, the antennas and output power amplifiers may be integrated on a high voltage (or equivalently, high bandgap) semiconductor substrate such as gallium arsenide, indium phosphide, or gallium nitride. In a wafer scale embodiment, the resulting wafer scale antenna module would be multi-layered, having a low voltage semiconductor wafer/substrate (such as silicon germanium or silicon) for supporting the transmission network and a high voltage semiconductor substrate for supporting the transmitter power amplifiers, receiver low-noise amplifiers, low-resistance and isolated switches, and the antennas. Referring back to FIG. 2, the low voltage substrate 162 and high voltage substrate 161 are conceptually illustrated. The active circuitry for the beam shaping and distributed amplification as well as the transmission networks is integrated with low voltage substrate 162. Conversely, the power amplifiers, low noise amplifiers, and antennas are integrated with high voltage substrate 161. It will thus be appreciated that the high voltage substrate is made transparent in FIGS. 3 and 4 so that the resonant transmission network, distributed amplifiers, and receiving network may also be shown. A high voltage substrate 161 such as gallium nitride may readily support voltages as high as 30V. In contrast, a low voltage substrate 162 such as silicon germanium may only be able to support voltages of 3V or less. It may thus be seen that power increases on the order of 20 dB may be achieved by using this multi-substrate architecture.

Figure 5:
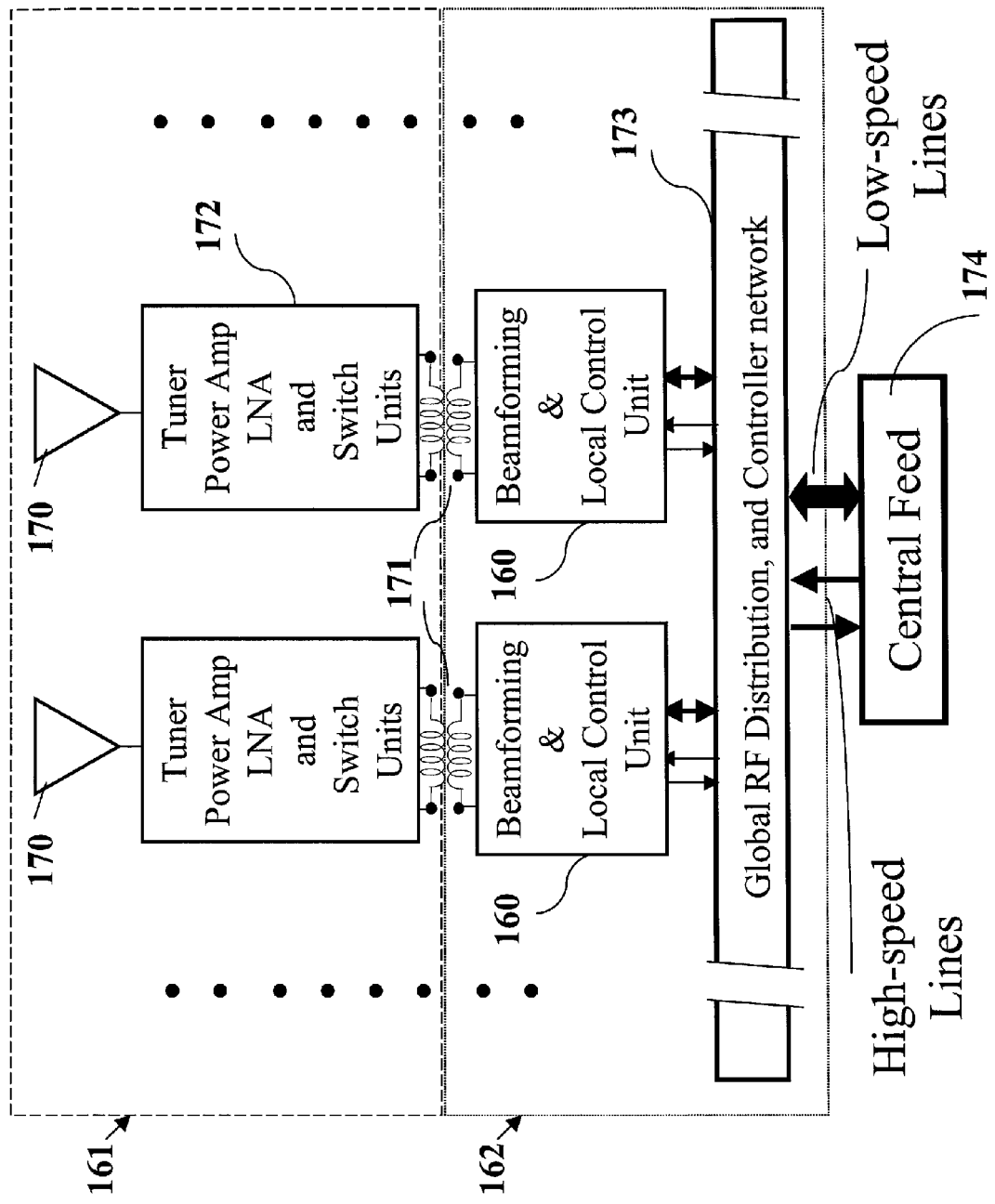
FIG. 5 is a conceptual cross-sectional view of a wafer scale antenna module having a high voltage substrate and a low voltage substrate.

A cross-sectional view of the resulting wafer scale antenna module is illustrated in FIG. 5. Referring back to FIG. 2, an ohmic coupling may be used to connect substrates 161 and 162. For example, appropriate pads may be formed on both substrates that are then bonded together. However, the resulting large area ohmic connections will introduce undesirable parasitic inductances and capacitances. In addition, the metal cluster on the ohmic connection will be subject to electromigration. Accordingly, an inductive coupling through the use of transformers 171 may be used as shown in FIG. 5. Should separate receive and transmit paths be used as discussed with regard to FIG. 2, each beamforming unit 160 would require two inductors to couple to the high voltage substrate. For illustration clarity, the switches (if necessary) and amplifiers discussed with regard to FIG. 2 are illustrated as units 172 in FIG. 5. Similarly, the distribution and control networks in the low voltage substrate are shown collectively as network 173. Because the control signals (such as beamforming commands) are low speed as compared to the higher frequency RF signals being used as carrier signals, a central feed 174 is shown interfacing with network 173 with both high speed and low speed signals.

Figure 6A:
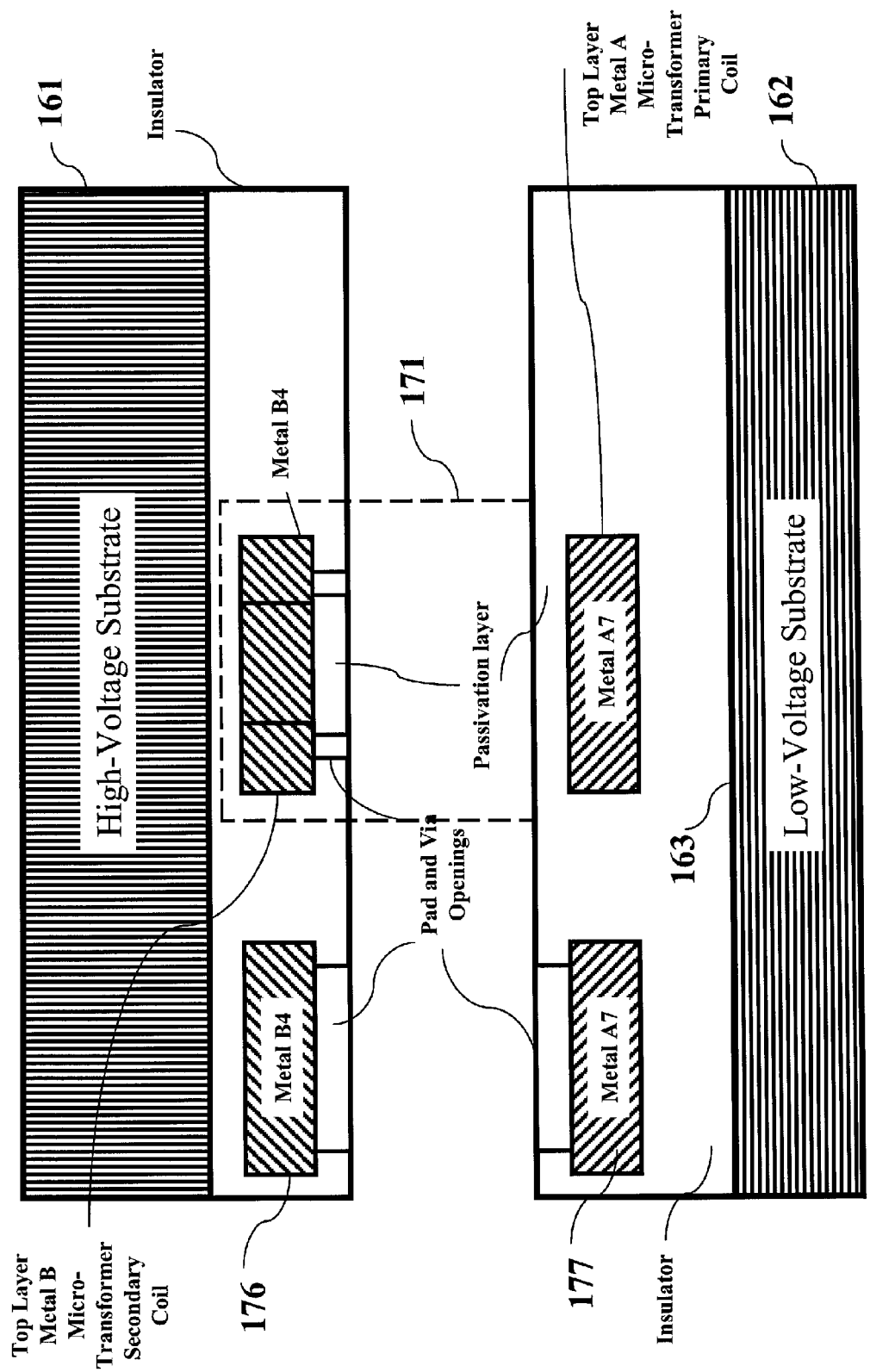
FIG. 6a is a cross-sectional view of a high, voltage substrate and a low voltage substrate wherein a passivation layer of the high voltage substrate is patterned to form vias for connection to a final coil for the transformer secondary.
Figure 6B:
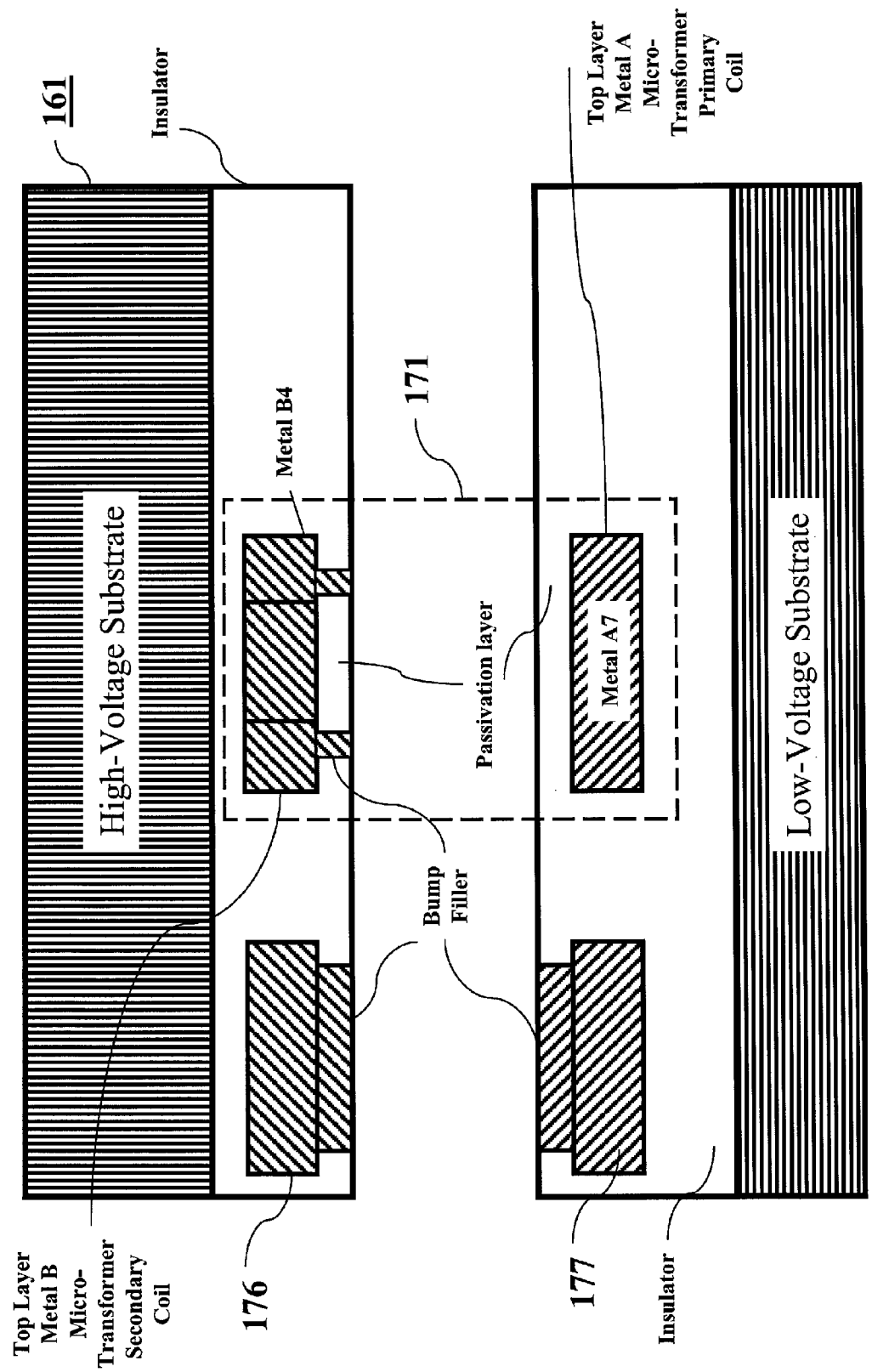
FIG. 6b is a cross-sectional view of the high voltage substrate and the low voltage substrate of FIG. 6a wherein the patterned passivation layer of the high voltage substrate is filled with metal to form the vias.
Figure 6C:
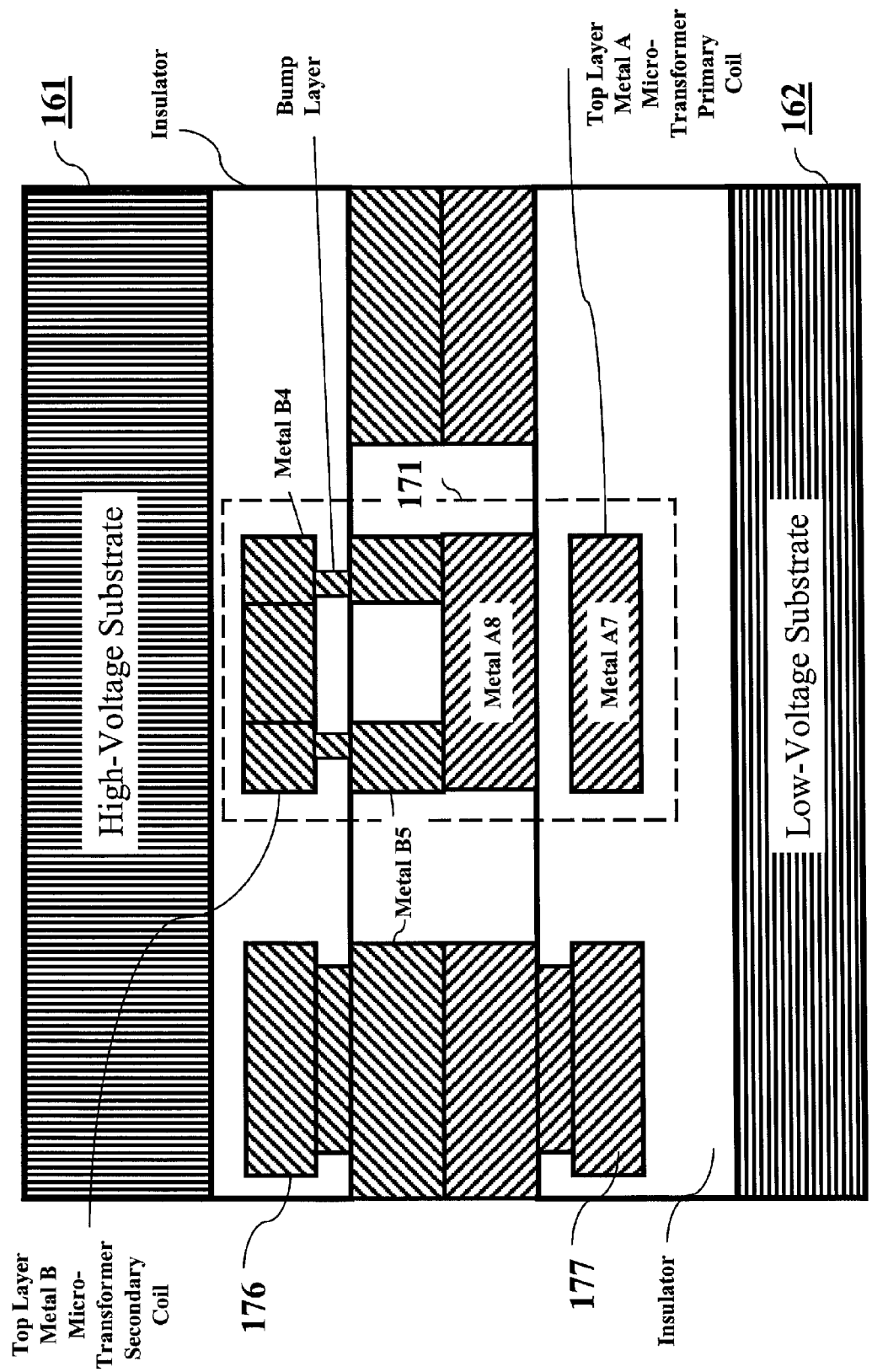
FIG. 6c is a cross-sectional view of the high voltage substrate and the low voltage substrate of FIG. 6b wherein the patterned passivation layers are covered with a final metal patterned metal layer to form a final coil for the transformer secondary and to bond together the substrates.

The integration of the transmission networks, the distributed amplification, and the multiple substrates into a wafer scale integrated antenna module (WSAM) may be better understood by the following discussion. The inductive coils for transformers 171 may be implemented using semiconductor processing metal layers as discussed in U.S. Pat. No. 6,963,307, the contents of which are incorporated by reference. The primary coil for each transformer 171 is formed on the low voltage substrate metal layers whereas the secondary coils are formed in the high voltage substrate metal layers. It will be appreciated that the separation between the primary and secondary coils should be minimized so as to enhance the inductive coupling. In addition, a secure method for bonding the substrates together is necessary. To achieve these goals, a manufacturing process such as illustrated in FIGS. 6a through 6c may be used. As will be discussed further, active devices such as the beamforming units and the distributed amplifiers may be integrated onto a surface 163 of low voltage substrate 162. The resonant transmission network and the receiving networks may be implemented using conductors formed in semiconductor process metal layers overlaying surface 163. These same layers may be used to form the primary coils for transformer 171. As known in the semiconductor manufacturing arts, a final metal layer such as metal layer A7 is then covered with a passivation layer (for illustration clarity, only metal layer A7 is shown for substrate 162). The high voltage substrate 161 may be processed in a corresponding fashion such that its metal layers are used to form the secondary coil for transformer 171. To achieve an enhanced inductive coupling between the primary and secondary coils, the passivation layer covering the furthest metal layer from substrate 161 (such as a metal layer B4) is etched to form openings such as done when forming pad windows as known in the semiconductor manufacturing arts (for illustration clarity, only metal layer B4 is shown for substrate 161). It will be appreciated that additional metal layers may be necessary to form additional coils. The greater the number of coils, the greater the inductance but the greater the impedance. Because the impedance also increases with operating frequency, fewer coils are necessary as the frequency increases.

The windows adjacent the B4 metal layer coil for the secondary are aligned and sized so that vias may be deposited using an appropriate bump filler such as copper as shown in FIG. 6b for attachment to a yet-to-be-formed final coil for the secondary. The resulting passivation layer surfaces for substrate 161 and 162 may then be processed using, for example, chemical-mechanical polishing so as to be flattened to an acceptable tolerance. These surfaces are then covered with an appropriate metal layer using deposition techniques such as sputtering. For high voltage substrates a metal such as gold is appropriate to form a metal layer B5 whereas a metal such as copper for the low voltage substrate is appropriate to form a metal layer A8. Metal layer A8 is patterned to form the final coil for the secondary. Metal layer B5 may be pattered to mirror the vias or the final coil. The deposition of metal layers A8 and B5 is patterned so that the final secondary coil separates from the remaining conductors in these layers by appropriate windows 174. Metal layers A8 and B5 thus are contacting except in the window regions. By heating the metals and applying appropriate pressure and/or ultrasonic vibration, metal layers A8 and B5 will alloy together as shown in FIG. 6c so as to bond the substrates to each other. Advantageously, the resulting primary and secondary coils for transformer 171 are separated only by the thickness of the passivation layer for the low voltage substrate, which is typically just a few microns or less.

The resulting bond between the substrates depends not only on the degree of alloying between the contacting metal layers but also on their own bond to the corresponding substrates. To enhance this substrate bonding, additional metal layers may form plates that couple to the final metal layers through metal-filled pad openings. For example, as shown in FIG. 6a, appropriate pad openings may be formed in the passivation layer adjacent a plate 176 and a plate 177 formed in metal layers B4 and A7, respectively. These openings are filled with metal as shown in FIG. 6b and then covered with metal as shown in FIG. 6c. In this fashion the bond of the metal layers A8 and B5 to their substrates is enhanced by "bolting" to additional adjacent metal layers. It will be appreciated that this bonding process may be extended through vias to underlying metal layers.

Figure 7A:
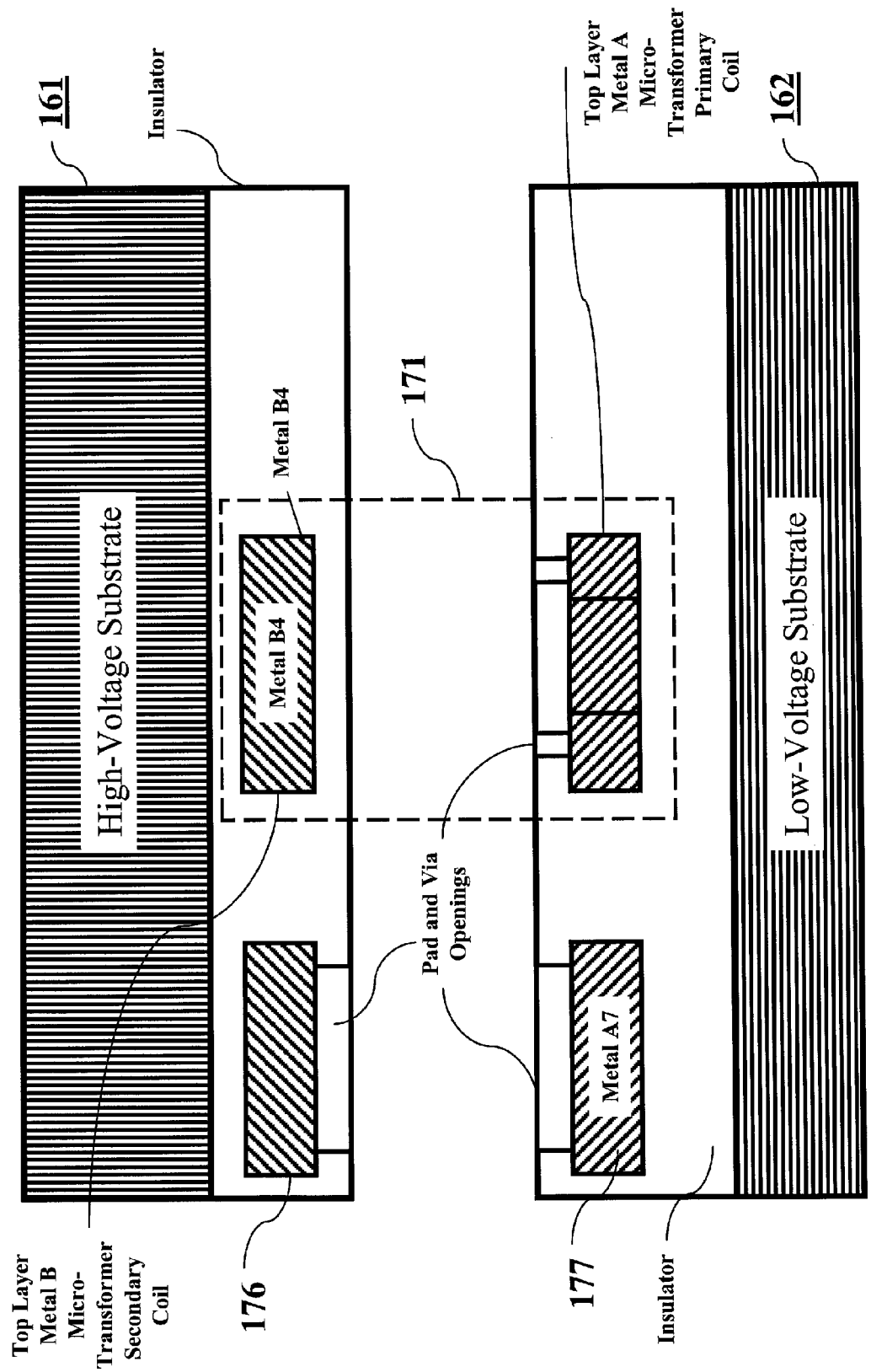
FIG. 7a is a cross-sectional view of a high voltage substrate and a low voltage substrate wherein a passivation layer of the low voltage substrate is patterned to form vias for connection to a final coil for the transformer primary.
Figure 7B:
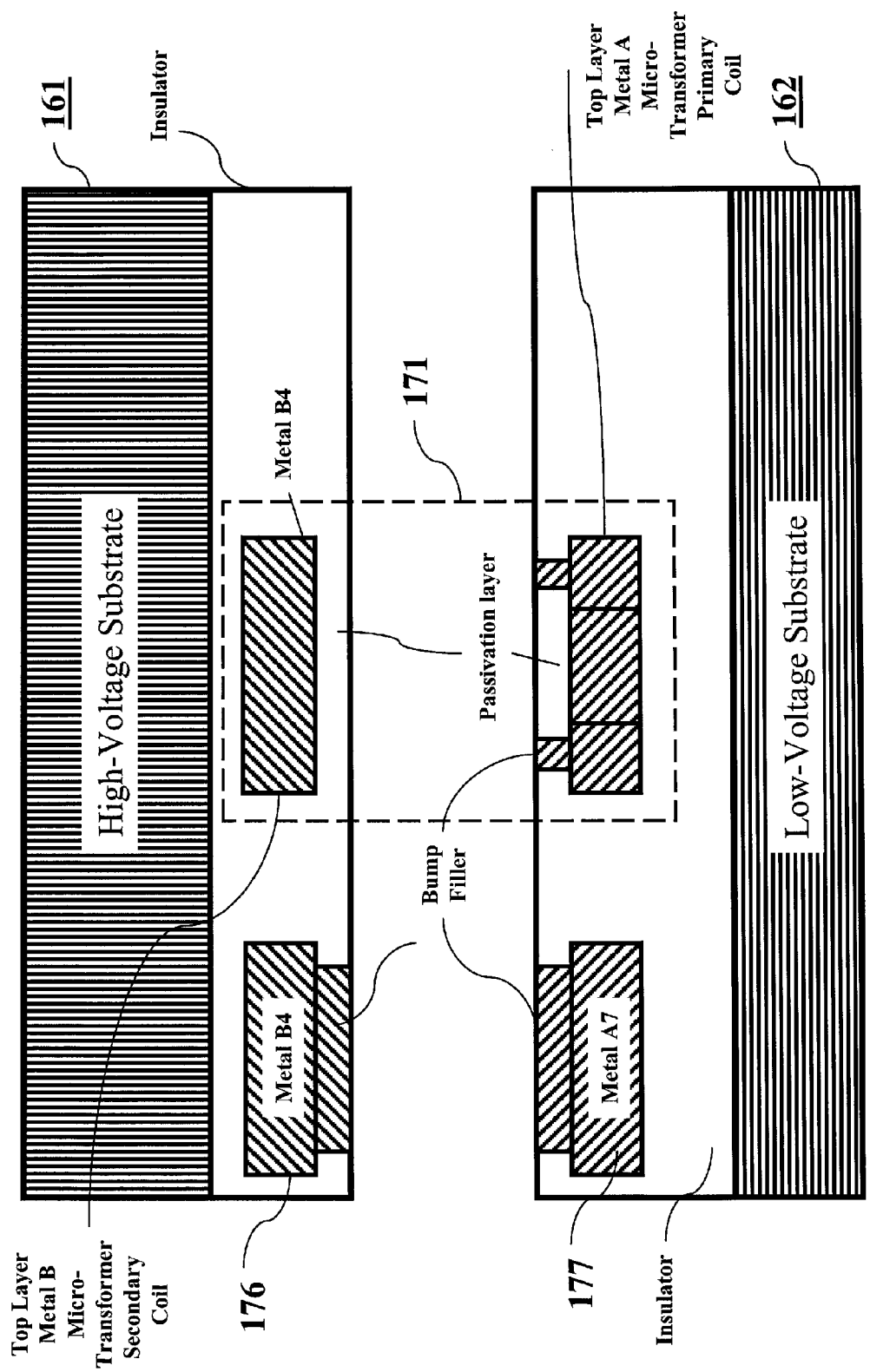
FIG. 7b is a cross-sectional view of the high voltage substrate and the low voltage substrate of FIG. 7a wherein the patterned passivation layer of the low voltage substrate is filled with metal to form the vias.
Figure 7C:
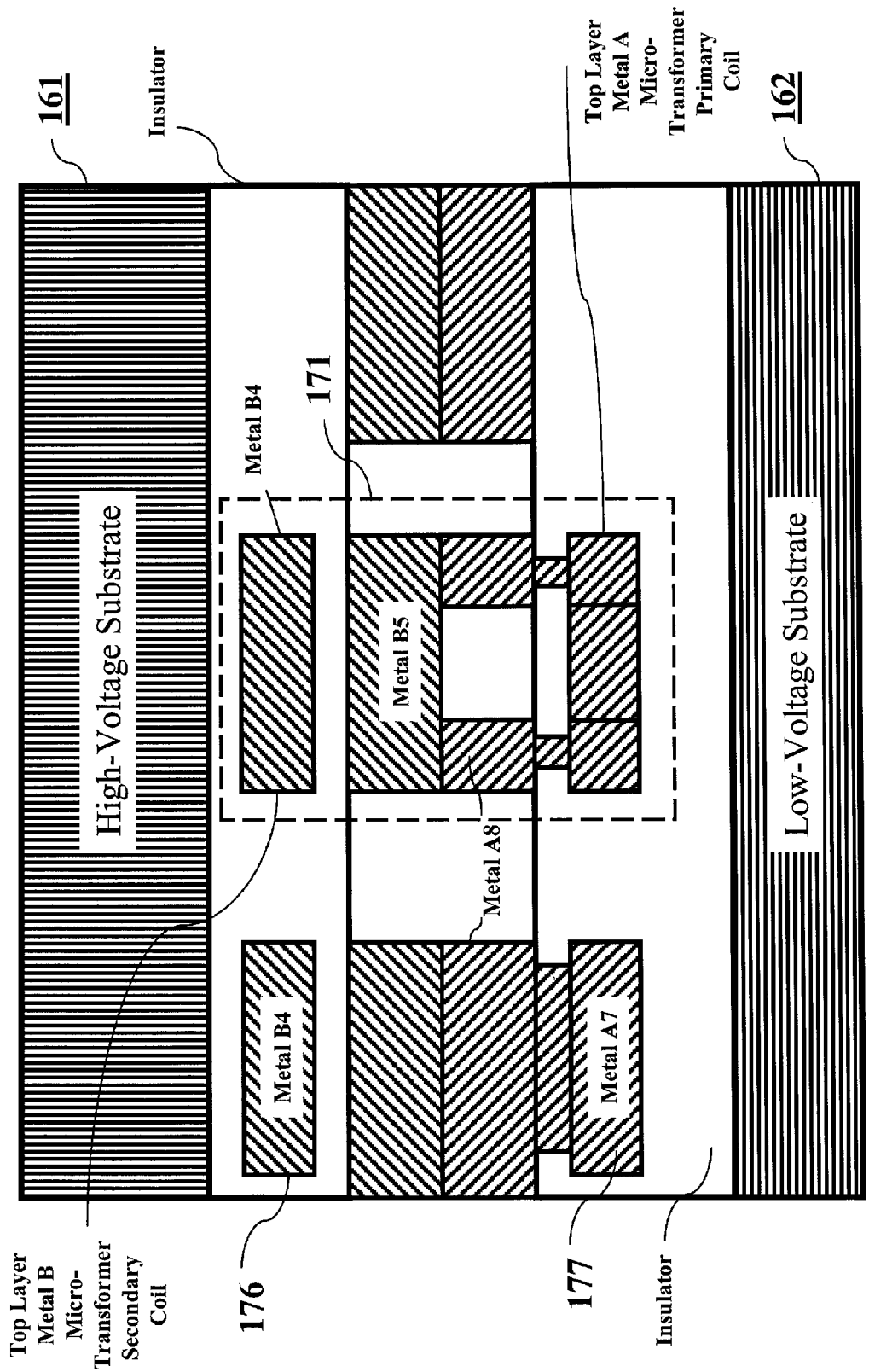
FIG. 7c is a cross-sectional view of the high voltage substrate and the low voltage substrate of FIG. 7b wherein the patterned passivation layers are covered with a final metal patterned metal layer to form a final coil for the transformer primary and to bond together the substrates.

Although the process shown in FIGS. 6a through 6c uses metal layer A8 for the low voltage substrate to form the final coil for the secondary, a complementary process would use the metal layer B5 for the high voltage substrate to form the final coil for the primary. This complementary process is shown in FIGS. 7a through 7c. Windows for vias to attach to a coil for the primary in metal layer A7 adjacent the low voltage are patterned in the passivation layer as shown in FIG. 7a. These windows are then filled with metal to form the vias as shown in FIG. 7b. Metal layers A8 and B5 are then deposited and patterned appropriately to form the final primary coil as seen in FIG. 7c. As discussed with regard to FIGS. 6a through 6c, plates such as plates 177 and 176 may be used to assist the bonding of the final metal layers to the corresponding substrates.

Figure 8:
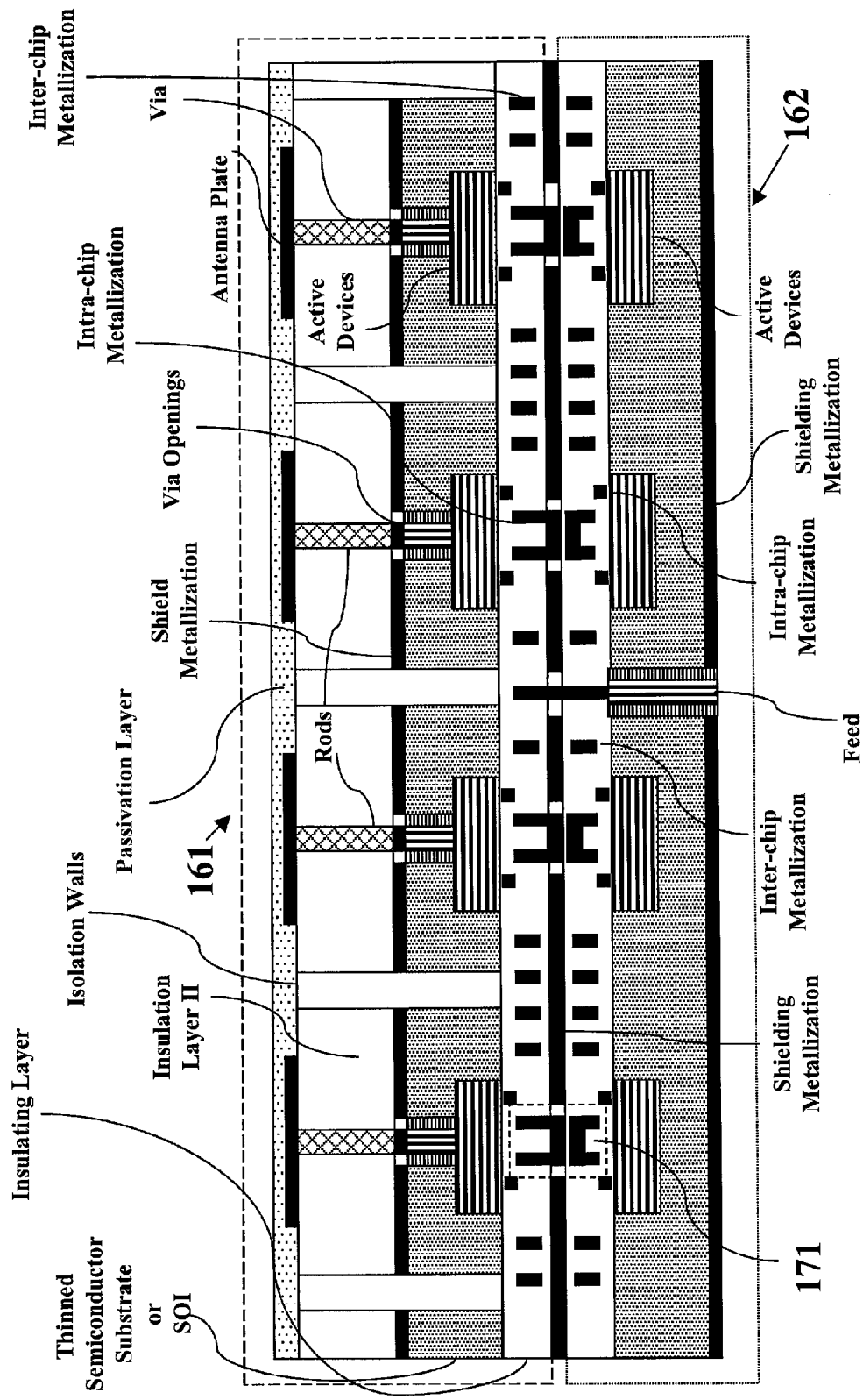
FIG. 8 is a cross-sectional view of a wafer scale antenna module constructed according to the process illustrated in FIGS. 6a-6c.
Figure 9:
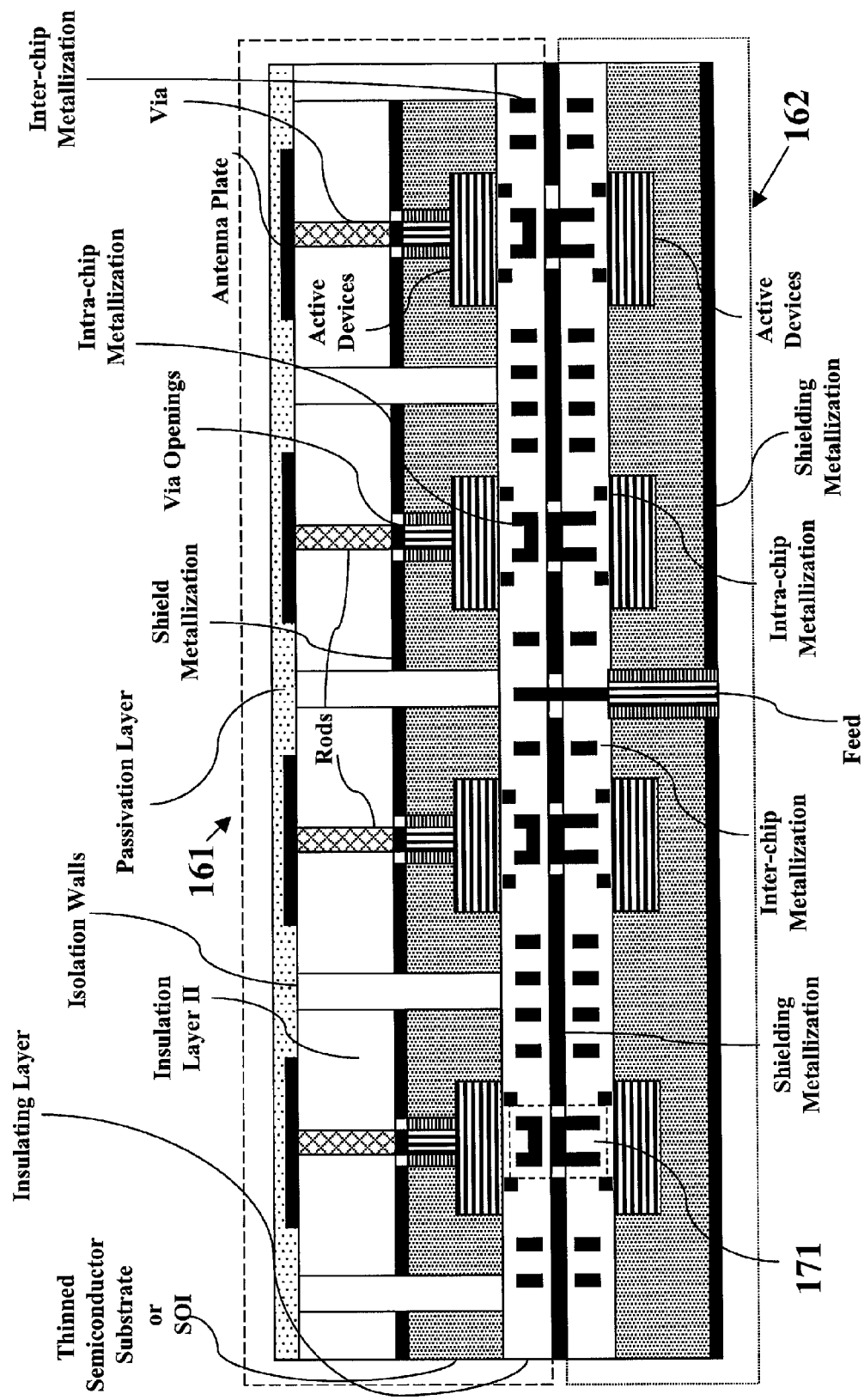
FIG. 9 is a cross-sectional view of a wafer scale antenna module constructed according to the process illustrated in FIGS. 7a-7c.

Example wafer scale antenna modules corresponding to the processes shown in FIGS. 6a-6c and 7a-7c are shown in FIGS. 8 and 9, respectively. In both these figures, substrate 162 includes a deep diffusion region to form a feed to supply power to the high voltage substrate 161. Formation of this junction is similar to a deep diffusion junction process used for the manufacturing of double diffused CMOS (DMOS) or high voltage devices. It provides a region of low resistive signal path to minimize insertion loss to the high voltage substrate. The metal layers adjacent the low voltage substrate form the transmission networks and the primary coils for transformers 171.

The high voltage substrate forms three layers as discussed, for example, in U.S. application Ser. No. 11/536,625. The first layer would be semiconductor substrate itself. On a first surface of the substrate, antennas such as patches are formed as discussed, for example, in U.S. Pat. No. 6,870,503, the contents of which are incorporated by reference herein. Active circuitry for the power amplifiers and other components that drive these antennas are formed on a second opposing surface of the substrate. The secondary coils for transformers 171 are formed in the metal layers adjacent this second opposing surface. The second layer would include the antennas on the first side of the high voltage substrate whereas the third layer would metal layers. Thus, such a WSAM includes the "back side" feature disclosed in U.S. Ser. No. 10/942,383, the contents of which are incorporated by reference, in that the active circuitry and the antennas are separated on either side of the substrate. In this fashion, electrical isolation between the active circuitry and the antenna elements is enhanced. Moreover, the ability to couple signals to and from the active circuitry is also enhanced. As discussed in U.S. Ser. No. 10/942,383, issued as U.S. Pat. No. 7,610,064, a heavily doped deep conductive junction through the substrate couples the active circuitry to vias/rods at the first substrate surface that in turn couple to the antenna elements. Formation of the junctions is similar to a deep diffusion junction process used for the manufacturing of double diffused CMOS (DMOS) or high voltage devices. It provides a region of low resistive signal path to minimize insertion loss to the antenna elements. The antennas are separated from the high voltage substrate by an insulating layer. To enhance isolation between the antennas, isolation walls may be formed using trench or SOI processes.

Upon formation of the junctions in the high voltage substrate, the active circuitry may be formed using standard semiconductor processes. The active circuitry may then be passivated by applying a low temperature deposited porous $SiO_x$ and a thin layer of nitridized oxide ($Si_xO_yN_z$) as a final layer of passivation. The thickness of these sealing layers may range from a fraction of a micron to a few microns. The opposing second surface may then be coated with a thermally conductive material and taped to a plastic adhesive holder to flip the substrate to expose the first surface. The substrate may then be back ground to reduce its thickness to a few hundreds of micro-meters.

An electric shield may then be sputtered or alternatively coated using conductive paints on background surface. A shield layer over the electric field may form a reflective plane for directivity and also shields the antenna elements. In addition, parts of the shield form ohmic contacts to the junctions. For example, metallic lumps may be deposited on the junctions. These lumps ease penetration of the via/rods to form ohmic contacts with the active circuitry.

Figure 10:
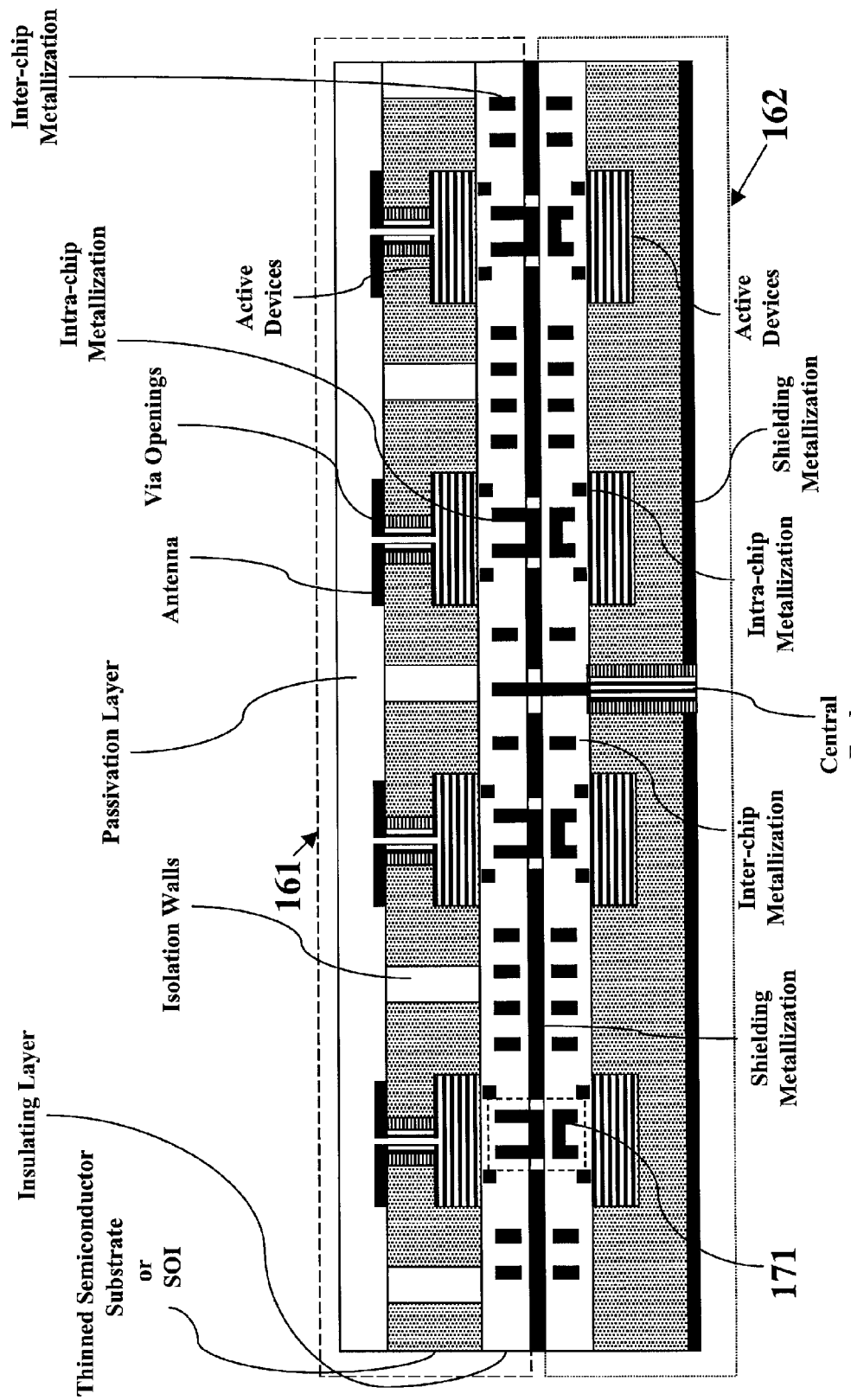
FIG. 10 is a cross-sectional view of a wafer scale antenna module in which the high voltage substrate has surface covered with a patterned metal layer to form the antennas.
Figure 11:
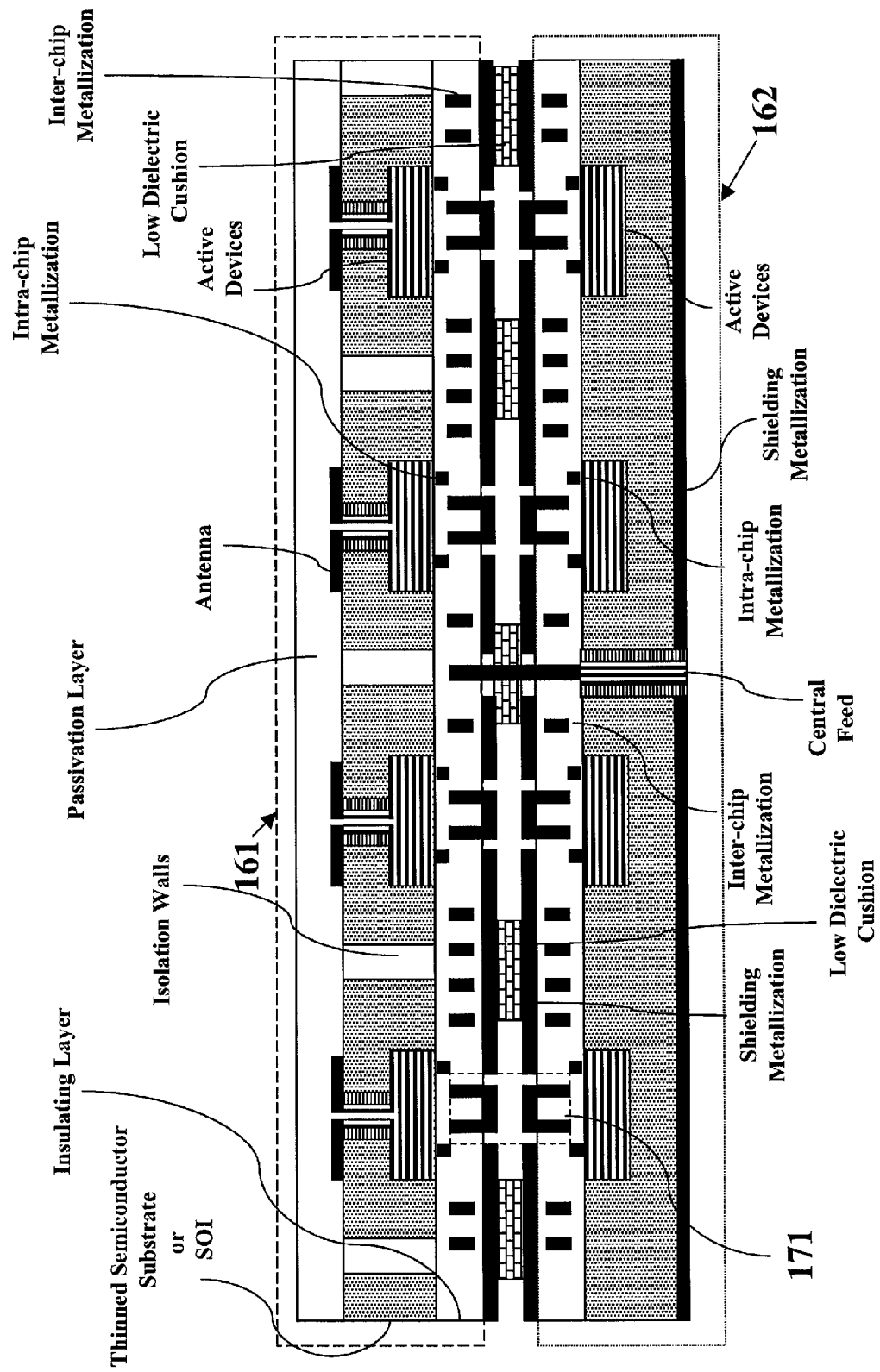
FIG. 11 is a cross-sectional view of a wafer scale antenna module in which the high voltage substrate is bonded to the low voltage substrate through a dielectric layer.
Figure 12:
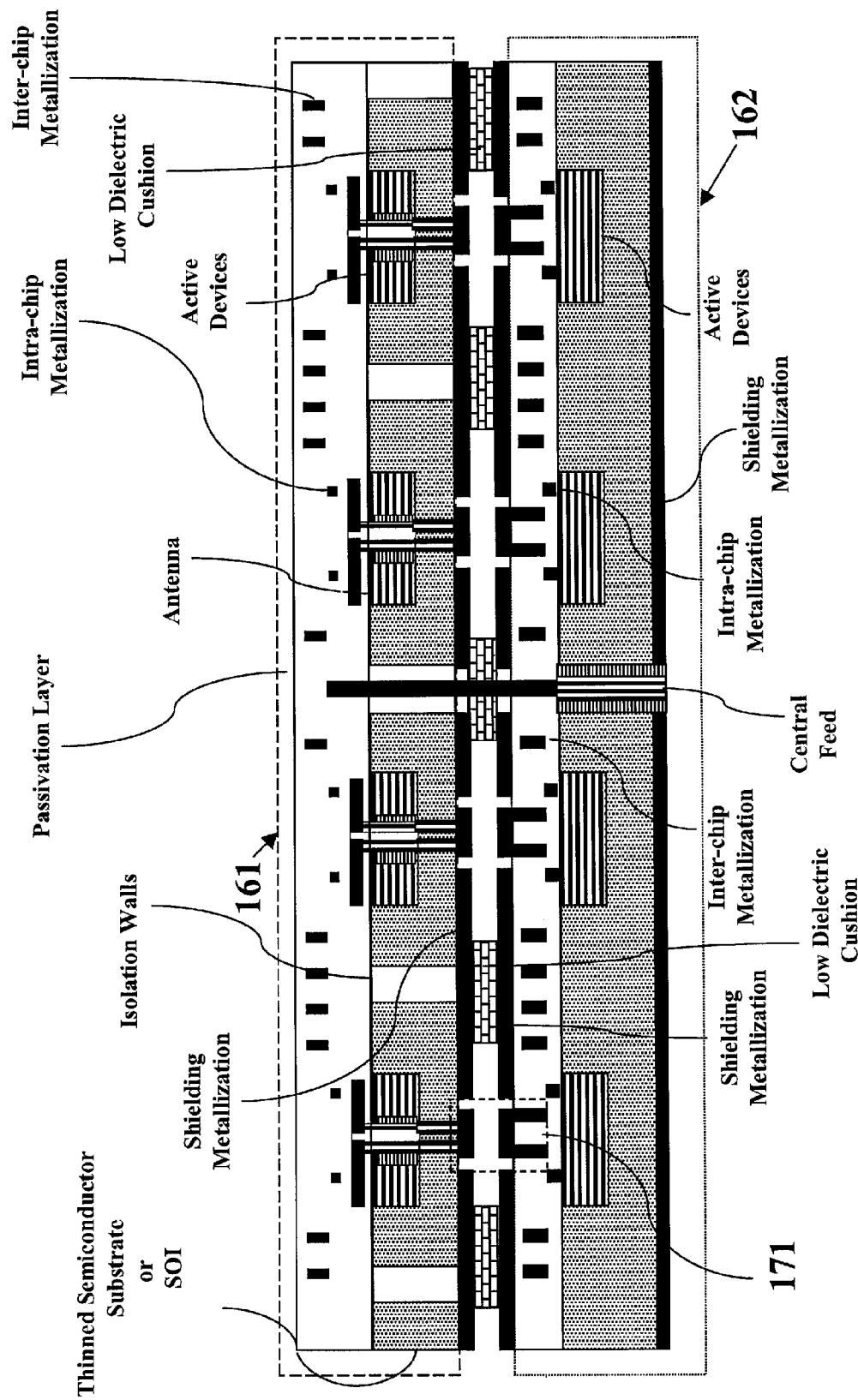
FIG. 12 is a cross-sectional view of a wafer scale antenna module in which the high voltage substrate has a first surface facing the low voltage substrate and in which the active devices for the high voltage substrate are integrated into an opposing second surface of the high voltage substrate.

The formation of the insulating layers and rods/vias on the high voltage substrate is not a conventional process practiced in semiconductor foundries and thus will introduce substantial cost into WSAM manufacture. An alternative approach is illustrated in FIGS. 10-12. As shown in FIG. 10, the metal layer sputtered or deposited onto the high voltage substrate surface opposing its active devices may be patterned to form antennas such as dipoles. For example, the T-shaped dipoles disclosed in U.S. Pat. No. 6,885,344, the contents of which are incorporated by reference, may be patterned into this metal layer. This metal layer is then passivated to complete the WSAM. In an alternative embodiment, the final metal layers which are alloyed together in FIG. 10 may be separated by, for example, dielectric cushions as shown in FIG. 11. In this fashion, the thermal separation between the substrates is enhanced and air passages are opened for cooling purposes. In yet another alternative embodiment, a backside approach is not used for the high voltage substrate as shown in FIG. 12. In this approach, the conventional semiconductor process metal layers are available to form the antennas. Because only a single metal layer is available on the opposing surface of the high voltage substrate, the secondary for transformers 171 can comprise only a single coil in such embodiments. A rod extends from the feed in the low voltage substrate through, for example, an isolation region for the high voltage substrate to its metal layers to supply power. The substrates may be bonded using dielectric cushions (as illustrated) or may be alloyed together as discussed previously.

Regardless of the particular embodiment used to form the resulting high power WSAM, it will be appreciated that the semiconductor processes available to form the low voltage substrate (such as CMOS) is considerably more advanced than the semiconductor processes available to form the high power substrate. Thus, the low voltage substrate advantageously can utilize the high density processes available in modern low voltage semiconductor processes. At the same time, such density is not so critical in the high voltage substrate such that it advantageously provides its high power amplification yet does not introduce density disadvantages.

It will be obvious to those skilled in the art that various changes and modifications may be made without departing from this invention in its broader aspects. The appended claims encompass all such changes and modifications as fall within the true spirit and scope of this invention.

I claim:

1. An integrated circuit antenna array, comprising:
   a low voltage substrate supporting an RF transmission network, and
   a high voltage substrate bonded to the low voltage substrate, the high voltage substrate supporting a plurality of antennas coupled to the RF transmission network through power amplifiers integrated into a surface of the high voltage substrate.

2. The integrated circuit antenna array of claim 1, wherein the RF transmission network comprises an RF feed network coupling to a distributed plurality of amplifiers integrated with the substrate, wherein the RF feed network and the distributed plurality of amplifiers are configured to form a resonant network such that if a timing signal is injected into an input port of the RF feed network, the resonant network oscillates to provide a globally synchronized RF signal to each of the antennas.

3. The integrated circuit antenna array of claim 2, wherein the RF feed network is implemented using waveguides selected from the group consisting of microstrip waveguides, co-planar waveguides, and planar waveguides.

4. The integrated circuit antenna array of claim 3, wherein the high voltage substrate has a first surface facing a first surface of the low voltage substrate, and wherein the RF feed network is a co-planar waveguide network formed in metal layers adjacent the first surface of the low voltage substrate.

5. The integrated circuit antenna array of claim 4, wherein the antennas are formed on an insulating layer adjacent an opposing second surface of the high voltage substrate.

6. The integrated circuit antenna array of claim 4, wherein the antennas are formed in metal layers adjacent an opposing second surface of the high voltage substrate.

7. The integrated circuit antenna array of claim 4, wherein the power amplifiers of the high voltage substrate couple to the RF feed network through transformers.

8. The integrated circuit antenna array of claim 7, wherein each transformer has a primary coil formed in the metal layers adjacent the first surface of the low voltage substrate and a secondary coil formed in metal layers adjacent the first surface of the high voltage substrate.

9. The integrated circuit antenna array of claim 8, wherein the metal layers adjacent the first surface of the high voltage substrate have an overlaying passivation layer and a final metal layer deposited on the overlaying passivation layer, and wherein the metal layers adjacent the first surface of the low voltage substrate have an overlaying passivation layer and a final metal layer deposited on the overlaying passivation layer, the final metal layers being joined through a dielectric to bond the high voltage substrate to the low voltage substrate.

10. The integrated circuit antenna array of claim 7, wherein the metal layers adjacent the first surface of the high voltage substrate have an overlaying passivation layer and a final metal layer deposited on the overlaying passivation layer, and wherein the metal layers adjacent the first surface of the low voltage substrate have an overlaying passivation layer and a final metal layer deposited on the overlaying passivation layer, the final metal layers being alloyed together to bond the high voltage substrate to the low voltage substrate.

11. The integrated circuit antenna array of claim 10, wherein the final metal layers form a final coil of the secondary for each of the transformers.

12. The integrated circuit antenna array of claim 10, wherein the final metal layers form a final coil for the primary for each of the transformers.

13. The integrated circuit antenna array of claim 4, wherein the power amplifiers of the high voltage substrate couple to the RF feed network through ohmic contacts.

14. The integrated circuit antenna array of claim 1, wherein the low voltage substrate comprises silicon and the high voltage substrate is selected from the group consisting of gallium arsenide, indium phosphide, and gallium nitride.

15. The integrated circuit antenna array of claim 1, wherein the low voltage substrate comprises a silicon wafer.

16. An antenna array, comprising:
   a high voltage semiconductor substrate having a first surface and an opposing second surface;
   a plurality of heavily-doped contact regions extending from the first surface to the second surface;
   a plurality of antennas formed on a metal layer deposited on the first surface, each antenna being coupled to corresponding ones of the contact regions by vias to corresponding power amplifiers integrated into the second surface of the high voltage semiconductor substrate; and
   a low voltage substrate having a first surface adjacent a plurality of metal layers forming a conductor-based RF feed network adjacent the first surface for coupling an input port to the plurality of antennas, the RF feed network coupling to a distributed plurality of amplifiers integrated into the first surface of the low voltage substrate, wherein the RF feed network and the distributed plurality of amplifiers are configured to form a resonant network such that if a timing signal is injected into the input port of the RF feed network, a globally synchronized RF signal is received at each of the antennas.

17. The antenna array of claim 16, wherein the low voltage substrate comprises silicon and the high voltage substrate is selected from the group consisting of gallium arsenide, indium phosphide, and gallium nitride.

18. The antenna array of claim 16, wherein the RF feed network is implemented using waveguides selected from the group consisting of microstrip waveguides, co-planar waveguides, and planar waveguides.

19. The antenna array of claim 16, wherein the low voltage substrate comprises a silicon wafer.

20. An antenna array, comprising:
a high voltage semiconductor substrate having a first surface and an opposing second surface;
a plurality of heavily-doped contact regions extending from the first surface to the second surface;
a plurality of antennas formed on an insulating layer deposited on the first surface, each antenna being coupled to corresponding ones of the contact regions by vias to corresponding power amplifiers integrated into the second surface of the high voltage semiconductor substrate; and
a low voltage substrate having a first surface adjacent a plurality of metal layers forming a conductor-based RF feed network adjacent the first surface for coupling an input port to the plurality of antennas, the RF feed network coupling to a distributed plurality of amplifiers integrated into the first surface of the low voltage substrate, wherein the RF feed network and the distributed plurality of amplifiers are configured to form a resonant network such that if a timing signal is injected into the input port of the RF feed network, a globally synchronized RF signal is received at each of the antennas.

* * * * *